US005591671A

United States Patent [19]
Kim et al.

[11] Patent Number: 5,591,671
[45] Date of Patent: Jan. 7, 1997

[54] METHOD FOR INTERCONNECTING LAYERS IN SEMICONDUCTOR DEVICE

[75] Inventors: Young-sun Kim, Seoul; Young-wook Park, Suwon, both of Rep. of Korea

[73] Assignee: Samsung Electronics Co., Ltd., Suwon, Rep. of Korea

[21] Appl. No.: 374,412

[22] Filed: Jan. 18, 1995

[30] Foreign Application Priority Data

Jan. 18, 1994 [KR] Rep. of Korea .......................... 94-876

[51] Int. Cl.$^6$ .................................................. H01L 21/283
[52] U.S. Cl. .......................... 437/190; 437/192; 437/195
[58] Field of Search .................................. 437/190, 192, 437/195, 189

[56] References Cited

U.S. PATENT DOCUMENTS

| | | | |
|---|---|---|---|
| 4,931,410 | 6/1990 | Tokunaga et al. | 437/189 |
| 5,124,780 | 6/1992 | Sandhu et al. | 437/192 |
| 5,444,018 | 8/1995 | Yost et al. | 437/190 |
| 5,462,895 | 10/1995 | Chen | 437/200 |
| 5,470,789 | 11/1995 | Misawa | 437/190 |

FOREIGN PATENT DOCUMENTS

| | | | |
|---|---|---|---|
| 168828 | 1/1986 | European Pat. Off. | 437/192 |
| 2-125447 | 5/1990 | Japan | 437/192 |

OTHER PUBLICATIONS

Ogawa et al., "Interface microstructure of titanium thin-film/silicon single-crystal substrate correlated with electrical barrier heights", J. Appl. Phys., vol. 70, No. 2, 15 Jul. 1991, pp. 827–832.

*Primary Examiner*—T. N. Quach
*Attorney, Agent, or Firm*—Cushman Darby & Cushman, IP Group of Pillsbury Madison & Sutro LLP

[57] ABSTRACT

A method for interconnecting layers in a semiconductor device, which can form a low resistance contact, is provided. An insulating layer is formed on a semiconductor substrate and an opening is formed in the insulating layer. The opening is a contact hole for exposing an impurity diffusion region formed on the semiconductor substrate, or a via hole for exposing a lower conductive layer formed on the semiconductor substrate. Subsequently, a titanium ohmic contacting layer and a titanium nitride barrier layer are formed in the interior of the opening hole and on the insulating layer in sequence. Thereafter, a refractory metal layer which completely fills the remainder of the opening hole by depositing the refractory metal on the barrier layer is formed. To improve a contacting property, the resultant is heat-treated at a temperature above 450° C. As a result, oxidation of the ohmic contacting layer and the barrier layer is prevented, and silicide is actively formed on the interface between the ohmic contacting layer and the silicon substrate, whereby the contacting resistance can be improved. The effect is enhanced for contact holes having a high aspect ratio and a small diameter.

12 Claims, 5 Drawing Sheets

METHOD FOR INTERCONNECTING LAYERS IN SEMICONDUCTOR DEVICE

BACKGROUND OF THE INVENTION

The present invention relates to a method for interconnecting layers in a semiconductor device, which enables a low-resistance contact.

According to the increased integration of semiconductor devices, the size of a contact hole is decreasing to below 1 µm. As a result, a structure of the interconnecting layer having an ohmic contact of low resistance is greatly required.

FIGS. 1A–1E are cross-sectional diagrams illustrating a method for interconnecting layers in a semiconductor device according to the prior art.

Referring to FIG. 1A, after field oxide layers 12 are formed on a semiconductor substrate 11 by a conventional local oxidation of silicon (LOCOS) method, impurities are injected into semiconductor substrate 11 exposed to a surface between field oxide layers 12 to thereby form an impurity diffusion region 13. Referring to FIG. 1B, an insulating material such as $SiO_2$ is vapor-deposited on the resultant structure using a general chemical vapor deposition (CVD) method to thereby form an insulating layer 14.

Referring to FIG. 1C, after a photoresist pattern (not shown) for forming the contact hole on insulating layer 14 is formed, the insulating layer is anisotropically etched using the photoresist pattern as an etching mask until the surface of impurity diffusion region 13 is exposed, thereby forming contact hole 15.

Referring to FIG. 1D, a titanium (Ti) layer 16 is formed by depositing titanium to a thickness of 300 Å–900 Å on the sides of contact hole 15, on impurity diffusion region 13 exposed by contact hole 15 and on insulating layer 14 using a sputtering method. Thereafter, a titanium nitride (TIN) layer 17 is formed by depositing titanium nitride to a thickness of 600 Å–2000 Å using the sputtering method. Subsequently, the above resultant structure is heat-treated in a nitrogen ($N_2$) atmosphere, at a temperature above 450° C.

Here, the TiN layer 17 is a barrier layer for preventing a reaction between a silicon layer constituting the impurity diffusion region 13 and an aluminum (Al) layer to be formed in a following process. Also, the Ti layer 16 is an ohmic contacting layer for enabling the low resistant contact between the TiN layer 17 and the impurity diffusion region 13.

Referring to FIG. 1E, an Al layer 18 filling the contact hole is formed by depositing aluminum on the above resultant structure using the sputtering method.

According to the method for interconnecting layers in the above-described conventional art, after the TiN layer is formed, the resultant structure is heat-treated at a temperature above 450° C. As a result, first, the adhesion between the impurities diffusion region and the barrier metal layers (TiN/Ti layers) can be improved. Second, as shown in FIG. 1D, a low resistance contacting layer, such as a $Ti_xSi_y$ layer 19, is formed on the interface between the barrier metal layer and the impurity diffusion region 13, thereby improving the interconnection property of the layers.

Shinichi Ogawa et al. report that when a heat-treatment process is performed after the contact hole is formed on a silicon (Si) substrate doped with impurities and a Ti layer is formed in the interior of the contact hole, $Ti_xSi_y$ is formed on the Ti/Si interface. Higher heat-treating temperatures facilitate the formation of a crystal phase $Ti_xSi_y$. As a result, the barrier height of the Ti/Si interface is decreased (see: "Interface Microstructure of Titanium Thin-film/Silicon Single-crystal Substrate Correlated with Electrical Barrier Heights," *Journal of Applied Physics*, Vol. 70, No. 2, 15 Jul. 1991, p827–832).

Also, as the barrier height decreases, the contact resistance decreases. Therefore, in order to improve the layers' contacting resistance property, it is desirable that the heat treatment be performed at a high temperature of about 500° C., at which the barrier height can be sufficiently decreased.

However, according to the method for interconnecting layers of the above-described conventional art, during the heat treatment in a reaction furnace for forming a low resistance contact layer between the TiN/Ti layer and the Si substrate, the TiN/Ti layer is changed into $Ti_xO_y$ and $TiO_xN_y$ layers by the oxygen existing in the reaction furnace. This phenomenon is severe when the heat treatment temperature is above 500° C. Here, surface oxidation of the TiN layer is increased and much $Ti_xO_y$ is remarkably formed on the interface between the Ti layer and the TiN layer. As a result, the layers' contacting resistance property deteriorates.

On the other hand, a step coverage of Ti/TiN layers formed by the sputtering method is poor. Especially, in the case of a contact hole which has a high aspect ratio and is small in diameter, very thin Ti/TiN layers are formed at the corners of the bottom of the contact hole. If the heat treatment is performed with such a thin Ti/TiN layer formed at the corners of the bottom of the contact hole, the Ti/TiN layer is completely oxidized. As a result, the contacting resistance at the corners of the contact hole is remarkably increased. Therefore, the deterioration of the contacting resistance property caused by the oxidation of the Ti/TiN layer generated during the heat treatment for forming the low-resistance contact layer is more severe for smaller contact holes.

As described above, in order to form a silicide which is stable in the electric property for improving the layers' interconnection property, the heat treatment must be performed at the high temperature and the oxidation of the barrier layer (TIN) and the ohmic contacting layer (Ti) during the heat treatment must be prevented.

SUMMARY OF THE INVENTION

It is an object of the present invention to provide a method for interconnecting layers in a semiconductor device for preventing the oxidation of the ohmic contact layer and the barrier layer which are formed before an opening hole is filled.

It is another object of the present invention to provide a method of interconnecting layers in a semiconductor device for improving the layers' interconnection property.

In order to achieve the above and other objects, the method for interconnecting layers in a semiconductor device of the present invention comprises the steps of: forming an insulating layer on a lower structure; forming an opening hole in the insulating layer; forming an ohmic contacting layer in the interior of the opening hole and on the insulating layer; forming a barrier layer on the ohmic contacting layer, to thereby form a resultant structure; forming a refractory metal layer by completely filling the opening hole by depositing the refractory metal on the resultant structure; and heat-treating the resultant structure.

Preferably, the lower structure is one of an impurity diffusion region formed on the semiconductor substrate and a conductive layer formed on the semiconductor substrate.

It is more preferable that the ohmic contacting layer be constituted by a material, e.g., Ti, Ta, W, Mo or Pt, which can form silicide by reacting with silicon ions. The barrier layer is preferably constituted by TiN. Preferably, the refractory metal is one selected from the group consisting of W, Cu, Mo, Au and Pt.

Also, the heat treatment is preferably performed at a temperature above 450° C., and more preferably, at 500°–550° C.

According to a preferred embodiment of the present invention, the method of the present invention further comprises the steps of forming a metal line by patterning the refractory metal layer between the formation of the refractory metal layer and the heat treatment, and forming an oxidation preventing layer on the resultant structure.

According to another preferred embodiment of the present invention, the method of the present invention further comprises the steps of leaving the refractory metal layer only in the interior of the opening hole by etching-back the refractory metal layer until the insulating layer is exposed, between the formation of the refractory metal layer and the heat treatment, and forming an oxidation preventing cap layer on the resultant structure for preventing the oxidation of the refractory metal layer during the heat treatment. Here, the oxidation preventing cap layer is preferably formed of TiN.

According to still another preferred embodiment of the present invention, the method of the present invention further comprises a step of forming an oxidation-preventing cap layer on the refractory metal layer between the formation of the refractory metal layer and the heat treatment. Here, the oxidation preventing cap layer is preferably formed of TiN.

Therefore, according to the method for interconnecting layers of the present invention, the ohmic contacting layer and the barrier layer are formed and the heat treatment is performed after the opening hole is completely filled by the refractory metal layer. As a result, the oxidation of the ohmic contacting layer and the barrier layer can be prevented and the formation of silicide in the bottom of the opening hole can be actively performed, thereby improving the layers' contacting resistance. This effect of the present invention is enhanced when the contact hole to be filled has a high aspect ratio and a small diameter.

BRIEF DESCRIPTION OF THE DRAWINGS

The above objects and advantages of the present invention will become more apparent by describing in detail preferred embodiments thereof with reference to the attached drawings in which.

DETAILED DESCRIPTION OF THE INVENTION

Referring to the appended drawings, the preferred embodiments of the present invention will be described in detail.

FIGS. 2A–2E are cross-sectional diagrams describing a method for interconnecting layers according to a preferred embodiments of the present invention.

Figure 1A:
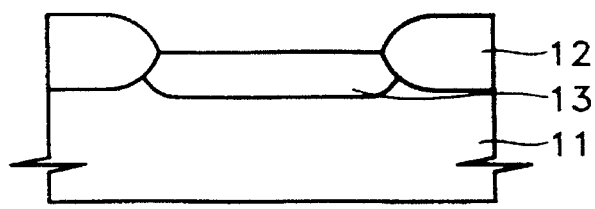
FIGS. 1A–1E are cross-sectional diagrams illustrating a method for interconnecting layers according to the prior art.
Figure 1B:
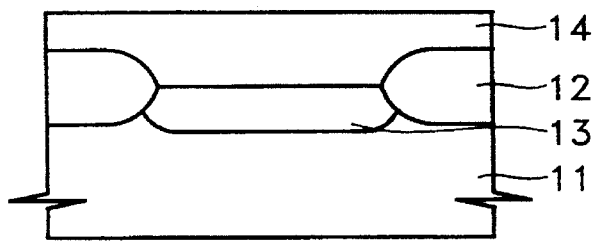
Figure 1C:
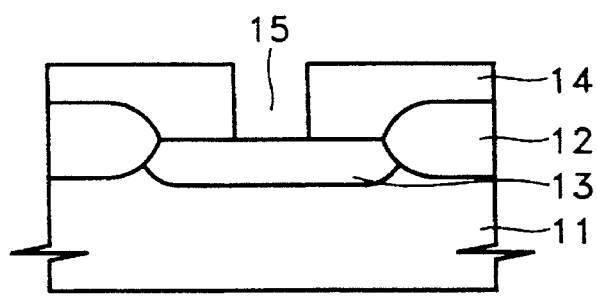
Figure 1D:
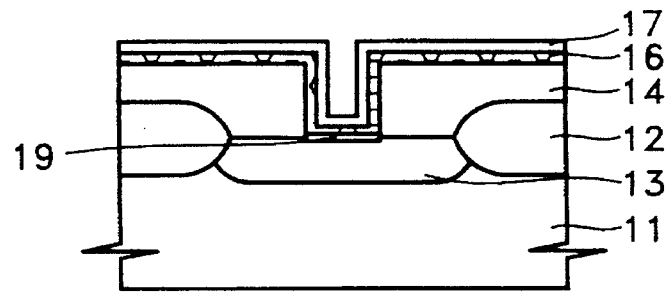
Figure 1E:
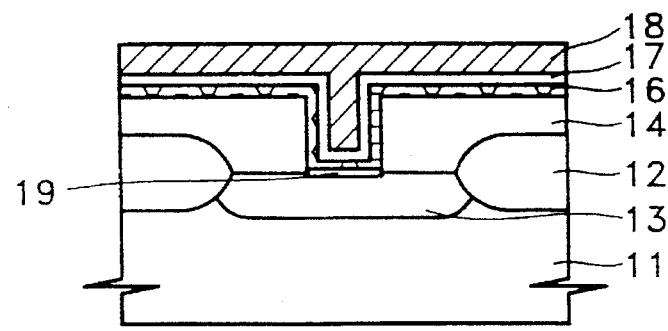
Figure 2A:
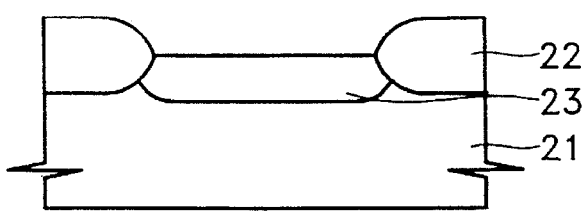
FIGS. 2A–2E are cross-sectional diagrams illustrating a method for interconnecting layers according to a preferred embodiment of the present invention.

First, referring to FIG. 2A, after field oxide layers 22 are formed on a semiconductor substrate 21 by a general LOCOS method, an impurity diffusion region 23 is formed by injecting a high concentration of impurities (N-type or P-type) in semiconductor substrate 21 between field oxide layers 22.

Here, the impurity diffusion region can be replaced with a conductive layer, such as a polycrystalline silicon layer, formed on the semiconductor substrate. That is, the present invention can be applied for filling a via hole connecting upper and lower conductive layers composed of polycrystalline silicon as well as filling a contact hole which exposes the impurity diffusion region.

Figure 2B:
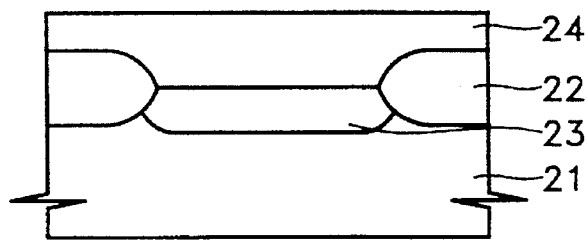

Referring to FIG. 2B, an insulating layer 24 is formed on the resultant structure on which impurities diffusion region 23 is formed, by depositing an insulating material such as $SiO_2$ using the conventional CVD method.

Figure 2C:
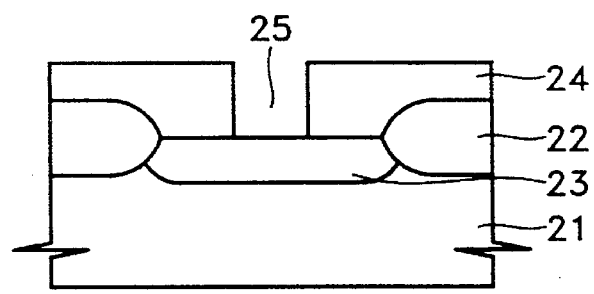

Referring to FIG. 2C, a photoresist pattern (not shown) for forming the opening hole is formed on insulating layer 24, and the insulating layer is anisotropically etched using the photoresist pattern as an etching mask until the surface of impurity diffusion region 13 is exposed, thereby forming contact hole 15. Here, the diameter of the contact hole is below 1 μm, e.g., 0.3 μm–0.8 μm.

Figure 2D:
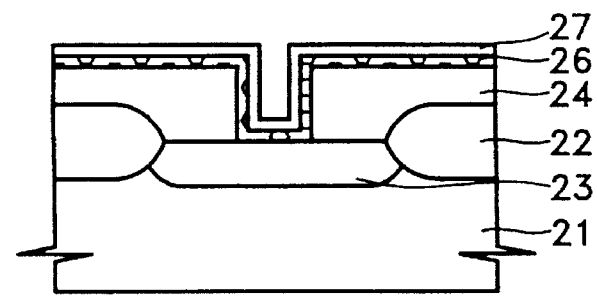

Referring to FIG. 2D, an ohmic contacting layer 26 is formed by vapor-depositing a refractory metal, e.g., Ti, to a thickness of 300 Å–900 Å in the interior of contact hole 25 and on insulating layer 24, using the sputtering method. Thereafter, a barrier layer 27 is formed by vapor-depositing titanium nitride to a thickness of 600 Å–2000 Å, using the sputtering method or the CVD method.

Here, instead of Ti, a material capable of forming refractory silicide by a reaction with silicon ions of the semiconductor substrate in the following heat treatment process, e.g., Ta, W, Mo, Pt, etc., can be used as the material for forming the ohmic contacting layer. On the other hand, barrier layer 27 serves as an adhesive layer for improving adhesion to refractory metal layer 28 to be formed layer, that is, a tungsten (W) layer and insulating layer 24, and as a diffusion-preventing layer for preventing reaction between the silicon ions of impurity diffusion region 23 and refractory metal layer 28.

Figure 2E:
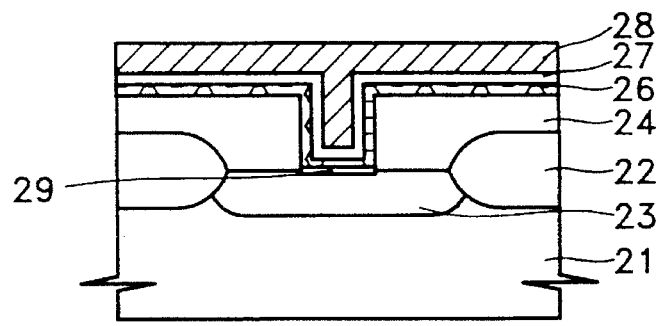

Referring to FIG. 2E, refractory metal layer 28 is formed by completely filling the contact hole by vapor-depositing the refractory metal on the whole surface of the above-described resultant structure. In order to form low ohmic contacting layer 29 for improving the layers' contacting property, the above-described resultant structure is preferably heat-treated at a temperature above 450° C., and more preferably, at 500° C.–550° C.

Here, refractory metal layer 28 is composed of a metal substance having a high melting point, e.g., W, Cu, Mo, Au or Pt. For example, if W is used as a refractory metal, a W layer is formed using a low-pressure CVD method in which a WF$_6$—H$_2$ or WF$_6$—SiH$_4$—H$_2$ reaction system is used as the reaction gas. Due to the very high melting point, the thermal stability of the formed W layer is high. Also, the resistance of the W layer is similar to that of aluminum, and electro-migration is excellent. Further, the W layer is formed by vapor-deposition using the CVD method, step coverage is excellent.

On the other hand, the heat treatment process can be performed under an atmospheric pressure, an argon or nitrogen atmosphere using a general furnace. As a result, refractory metal silicide layer 29, such as Ti$_x$Si$_y$, can be stably formed on the interface of impurity diffusion region 23 and ohmic contacting layer 26.

Also, since the heat treatment is performed after forming refractory metal layer 28 on barrier layer 27, oxidation of barrier layer and ohmic contacting layer during the heat treatment process can be prevented, thereby preventing the deterioration of the contacting resistance property. As described above, if the contact hole has a high aspect ratio and a small diameter, the contacting resistance improving effect obtained by the oxidation prevention of TiN/Ti layers is notable.

In practicing a method for interconnecting layers according to another preferred embodiment of the present invention, after performing the process of FIG. 2D, the refractory metal layer is formed on the resultant using the method as described with respect to FIG. 2E. Thereafter, the refractory metal layer is patterned together with a barrier layer and an ohmic contacting layer 26, which are laminated on an insulating layer, thereby forming a metal pattern. If the refractory metal layer is formed from a material which is oxidized when exposed to oxygen, an insulating layer is formed on the whole surface of the resultant structure for preventing the oxidation of the barrier layer and the ohmic contacting layer. Subsequently, a low ohmic contacting layer is formed between ohmic contacting layer and the impurity diffusion region, by heating the resulting structure using the heat treatment process as described with respect to FIG. 2E.

The above-described preferred embodiment is more effective when refractory metal layer 28 is composed of an easily oxidizable refractory metal.

Figure 3A:
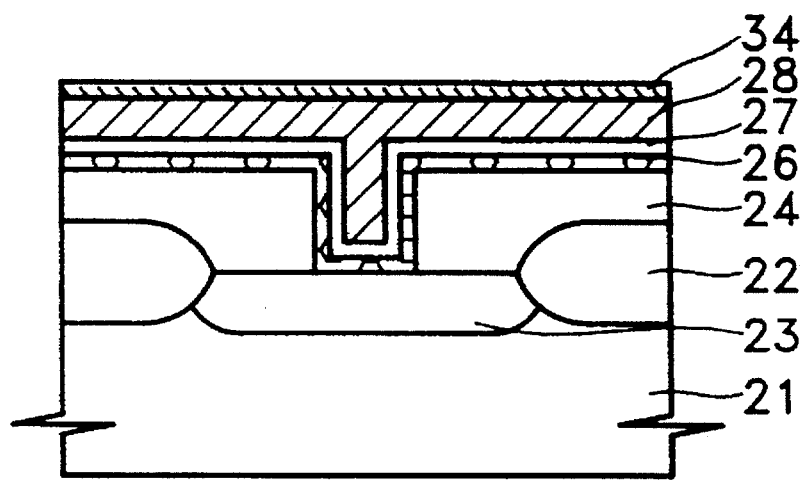
FIGS. 3A–3B are cross-sectional diagrams illustrating a method for interconnecting layers according to another preferred embodiment of the present invention.
Figure 3B:
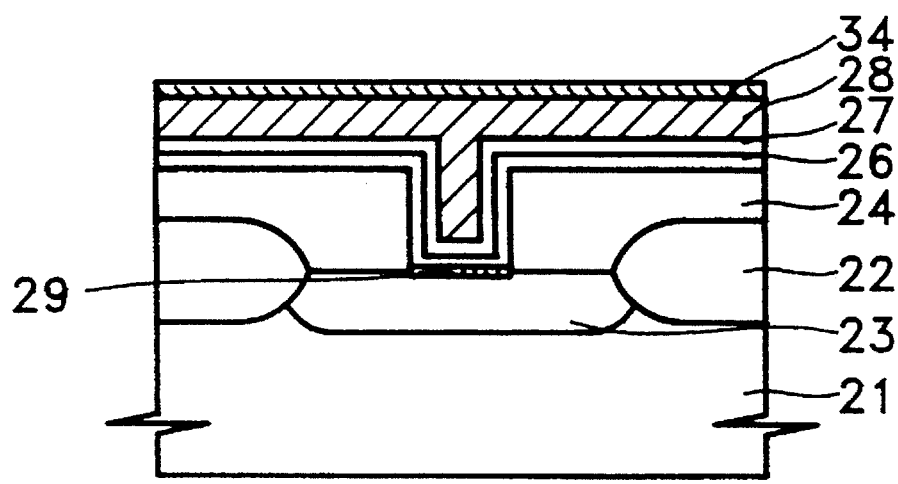

FIGS. 3A–3B are cross-sectional diagrams illustrating a method for interconnecting layers according to still another preferred embodiment of the present invention. The method described with respect to this embodiment is more effective when refractory metal layer 28 is composed of an easily oxidizable refractory metal.

After refractory metal layer 26 is formed using the method as described with respect to FIG. 2E, an oxidation preventing cap layer 34 is formed by depositing a substance, such as TiN, on the refractory metal layer (FIG. 3A). Thereafter, low ohmic contacting layer 29 is formed by heating the resultant structure under the conditions as described with respect to FIG. 2E (FIG. 3B).

Figure 4A:
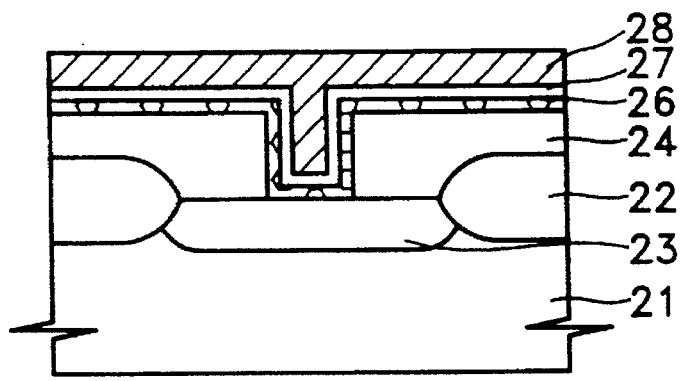
FIGS. 4A–4C are cross-sectional diagrams illustrating a method for interconnecting layers according to still another preferred embodiment of the present invention.
Figure 4B:
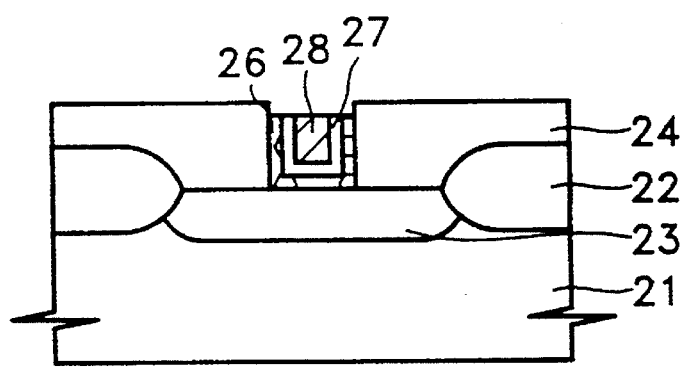
Figure 4C:
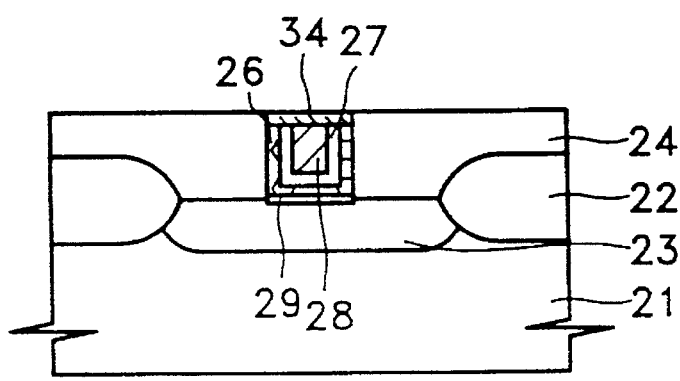

FIGS. 4A–4C are cross-sectional diagrams illustrating a method for interconnecting layers according to yet another preferred embodiment of the present invention. Here, the refractory metal layer is used as a plug by forming refractory metal layer only in the contact hole.

After refractory metal layer 28 is formed using the method as described with respect to FIG. 2E (FIG. 4A), the metal substance laminated on insulating layer 24 is etched-back, thereby leaving the metal substance only in the contact hole (FIG. 4B). Subsequently, an oxidation preventing cap layer 34 is formed by vapor-depositing a substance, such as TiN, on the resultant structure. Thereafter, low ohmic contacting layer 29 is formed by heating the resultant structure (FIG. 4C).

Table 1 is for comparing the method for interconnecting layers of the prior art, with a process procedure of the present invention. In the prior art, the metal layer is formed after performing the heat treatment. However, the heat treatment is performed after forming the metal layer in the present invention. Also, aluminum is used as the metal layer in the prior art, while the refractory metal is used as the metal layer in the present invention.

Figure 5:
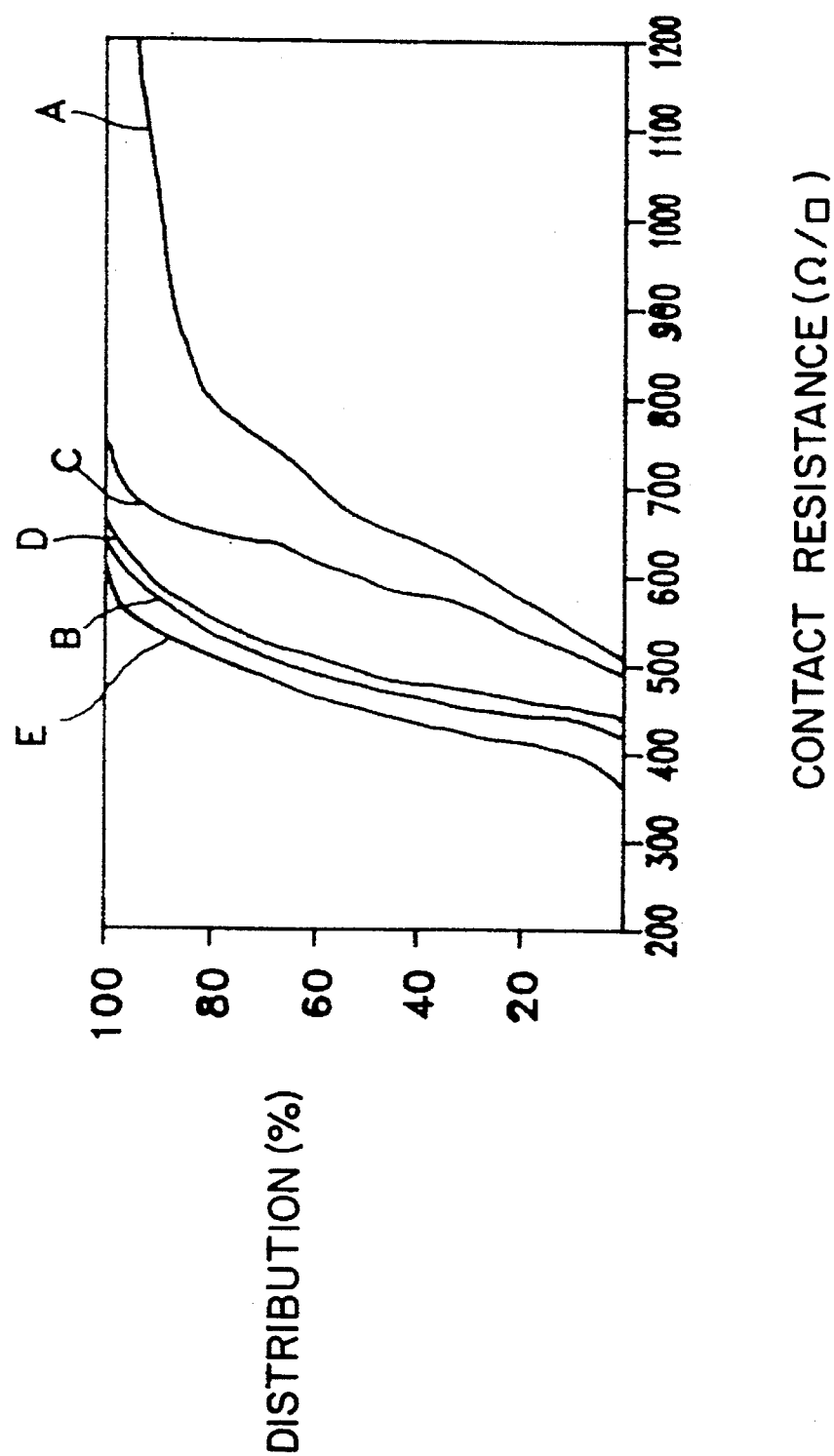
FIG. 5 is a graph showing a contacting resistance when a 0.3 μm-diameter contact hole formed on a silicon substrate doped with highly concentrated P-type impurities, is filled using the present invention compared with the case using the prior art.

FIG. 5 is a graph showing a contacting resistance when the contact hole having a diameter of 0.3 μm, which is formed on a silicon substrate doped with highly concentrated P-type impurities, as filled using the methods according to the present invention, compared with the case using the prior art.

In FIG. 5, reference character A is a case where the contact is formed by the prior art, and reference characters B, C, D and E are the cases of the present invention. In more detail, reference characters B, C, D and E represent that the heat-treatment was carried out at 500° C. for 60 minutes, at 550° C. for 10 minutes, at 550° C. for 30 minutes, and at 550° C. for 60 minutes, respectively, after the ohmic contacting layer and barrier layer are formed and the refractory metal layer is formed thereon by the method according to the present invention. As shown in FIG. 5, the contacting resistance of the contact formed by the method according to the present invention is improved compared with that formed by the conventional method.

TABLE 1

| step | conventional art | present invention |
|---|---|---|
| step 1 | impurity region & lower conductive layer formation | impurity region & lower conductive layer formation |
| step 2 | insulating layer formation | insulating layer formation |
| step 3 | contact hole & via hole formation | contact hole & via hole formation |
| step 4 | ohmic layer & barrier layer formation | ohmic layer & barrier layer formation |
| step 5 | heat treatment | refractory metal layer formation |
| step 6 | metal layer formation | heat treatment |

Thus, according to the method for manufacturing the semiconductor device of the present invention, after the ohmic contacting layer or the barrier layer is formed and the opening hole is filled by the refractory metal layer, the heat treatment is performed. As a result, the oxidation of the ohmic contacting layer and the barrier layer is prevented, and silicide is actively formed on the interface between the ohmic contacting layer and the silicon substrate, whereby the contacting resistance can be improved. This effect of the present invention is remarkable when the contact hole has a high aspect ratio and is small in diameter.

The present invention has been described above through the preferred embodiments. However, the present invention is not limited to the preferred embodiments and various modifications are possible within the scope of the present invention, as understood by one skilled in the art.

What is claimed is:

1. A method for interconnecting layers in a semiconductor device comprising the steps of:

forming a conductive layer on a semiconductor layer;

forming an insulating layer on said conductive layer;

forming an opening through said insulating layer, thereby exposing a portion of said conductive layer, said opening having an interior;

forming an ohmic contacting layer in the interior of said opening on said portion of said conductive layer and on said insulating layer leaving a first remainder of said opening partly unfilled;

forming a barrier layer on said ohmic contacting layer, thereby partly filling said first remainder of said opening, and thereby creating a resultant structure;

forming a refractory metal layer by completely filling said first remainder of said opening by depositing the refractory metal on said resultant structure; and heat-treating said resultant structure at a temperature of 500° C. to 550° C. after forming said refractory metal layer so that oxidation of said ohmic contacting layer and said barrier layer is prevented.

2. A method for interconnecting layers in a semiconductor device as claimed in claim 1, wherein:

said semiconductor layer is a semiconductor substrate; and said conductive layer is an impurity diffusion region formed in said semiconductor substrate.

3. A method for interconnecting layers in a semiconductor device as claimed in claim 1, wherein said ohmic contacting layer is constituted by a material selected from the group consisting of Ti, Ta, W, Mo and Pt.

4. A method for interconnecting layers in a semiconductor device as claimed in claim 1, wherein said barrier layer is constituted by TiN.

5. A method for interconnecting layers in a semiconductor device as claimed in claim 1, wherein said refractory metal layer is constituted by a material selected from the group consisting of W, Cu, Mo, Au and Pt.

6. A method for interconnecting layers in a semiconductor device as claimed in claim 1, further comprising a step of forming a metal line by patterning the refractory metal layer together with said barrier layer and ohmic contacting layer formed on said insulating layer, between the formation step of the refractory metal layer and the heat treatment step.

7. A method for interconnecting layers in a semiconductor device as claimed in claim 7, further comprising a step of forming an oxidation-preventing layer over the resultant structure, between the formation step of the metal line and the heat treatment step, to prevent oxidation of the refractory metal layer during the heat treatment step.

8. A method for interconnecting layers in a semiconductor device as claimed in claim 1, further comprising a step of etching-back said refractory metal layer together with said barrier layer and ohmic contacting layer until said insulating layer is exposed, between said formation step of the refractory metal layer and the heat treatment step, thereby leaving said refractory metal layer only in the interior of said opening.

9. A method for interconnecting layers in a semiconductor device as claimed in claim 8, further comprising a step of forming an oxidation preventing cap layer on the resultant structure between said step of etching-back the metal layer and said heat treatment step, for preventing the oxidation of said refractory metal layer during the heat treatment step.

10. A method for interconnecting layers in a semiconductor device as claimed in claim 9, wherein said oxidation-preventing cap layer is formed of TiN.

11. A method for interconnecting layers in a semiconductor device as claimed in claim 1, further comprising a step of forming an oxidation-preventing cap layer on said refractory metal layer, between said formation step of the refractory metal layer and the heat treatment step, to prevent oxidation of said refractory metal layer during the heat treatment step.

12. A method for interconnecting layers in a semiconductor device as claimed in claim 11, wherein said oxidation-preventing cap layer is formed of TIN.

* * * * *